US012801091B2

(12) United States Patent
Robinson et al.

(10) Patent No.: US 12,801,091 B2
(45) Date of Patent: Nov. 17, 2026

(54) MICRODIAL—MINIATURIZED APPARATUS FOR SOLAR TIME KEEPING

(71) Applicant: The Government of the United States of America, as represented by the Secretary of the Navy, Arlington, VA (US)

(72) Inventors: Jeremy T. Robinson, Washington, DC (US); Woodruff T. Sullivan, Seattle, WA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 549 days.

(21) Appl. No.: 18/113,044

(22) Filed: Feb. 22, 2023

(65) Prior Publication Data

US 2023/0266715 A1 Aug. 24, 2023

Related U.S. Application Data

(60) Provisional application No. 63/313,573, filed on Feb. 24, 2022.

(51) Int. Cl.
*G04B 49/02* (2006.01)
*G03F 7/00* (2006.01)
(Continued)

(52) U.S. Cl.
CPC ........... *G04B 49/02* (2013.01); *G03F 7/0005* (2013.01); *G06T 7/246* (2017.01); *H04N 25/76* (2023.01)

(58) Field of Classification Search
CPC ........ G01C 17/00; G01C 17/43; G01C 21/02; G04B 49/00; G04B 49/04; G04B 49/02;
(Continued)

(56) References Cited

U.S. PATENT DOCUMENTS 4,649,899 A * 3/1987 Moore .................... F24S 50/20
250/203.4
4,782,472 A * 11/1988 Hines ........................ G04G 9/00
33/270

(Continued)

OTHER PUBLICATIONS

Liebe, CC et al. MEMS based Sun sensor. IEEE Aerospace Conference, Proceedings, vol. 3, Jan. 1, 2001, pp. 1565-1572 [online], [retrieved on Jul. 21, 2025]. Retrieved from the Internet <URL: https://ieeexplore.ieee.org/document/1035393?source=IQplus> <DOI: 10.1109/AERO.2002.1035393.> (Year: 2001).*

(Continued)

*Primary Examiner* — Natalie Huls
*Assistant Examiner* — Daniel M Quinn
(74) *Attorney, Agent, or Firm* — US Naval Research Laboratory; Stephen T. Hunnius

(57) ABSTRACT

A miniaturized apparatus for tracking the apparent motion of the sun comprising a light mask, a pixilated image sensor, and an image processing unit, wherein sunlight transmitted through the light mask allows the miniaturized apparatus to make time, latitude, direction, and date measurements. A method of making a miniaturized apparatus for tracking the apparent motion of the sun comprising the steps of providing a light mask, providing a pixilated image sensor, providing an image processing unit, and resulting in a miniaturized apparatus for tracking the apparent motion of the sun.

12 Claims, 4 Drawing Sheets

(51) Int. Cl.
*G06T 7/246* (2017.01)
*H04N 25/76* (2023.01)

(58) Field of Classification Search
CPC .. G01B 49/02; G01N 33/5088; G03F 7/0005; G03F 7/0002; G03F 7/2063; G03F 7/70441; G03F 1/22; G03F 1/24; G03F 1/36; G03F 1/38; G03F 1/50; G03F 1/60; G03F 1/70; G06T 7/246; G06T 7/521; G06T 7/557; G06T 5/20; G06T 15/04; Y02E 10/47; H04N 25/76; H04N 25/616; H04N 25/65; H04N 25/672; H04N 25/677; H04N 25/70; H04N 25/78; H04N 23/957; H04N 23/11; H04N 23/55; H04N 23/80; H04N 1/32128; H04N 13/207; H04N 2201/3243; H04N 2201/325; H04N 2201/3277; H04N 2201/33378; H04N 5/145; G02B 30/27; G02B 30/00; G02B 30/56; G02B 27/4272; G02B 27/60; G02B 27/0103; G02B 27/09; G02B 27/0933; G02B 27/0994; G02B 27/1093; G02B 27/285; G02B 27/4205; G02B 27/44; G02B 3/0037; G02B 3/0043; G02B 3/0056; G02B 3/0062; G02B 3/0068; G02B 3/0075; G02B 3/00; G02B 3/0006; G02B 3/0018; G02B 3/08; G02B 1/115; G02B 13/04; G02B 19/0028; G02B 19/0042; G02B 2003/0093; G02B 5/0242; G02B 5/0278; G02B 5/1857; G02B 5/1866; G02B 5/1871; G02B 5/30; G02B 5/32; G02B 6/0001; G02B 6/0011; G02B 6/0038; G02B 6/0046; G02B 6/0053; G02B 6/0078; G02B 6/04; G02B 6/06; G02B 6/10; G02B 6/26; G02B 7/005; G02B 7/023; G02B 2006/12195; H10F 39/8057; H10F 39/024; H10F 39/12; H10F 39/1534; H10F 39/1536; H10F 39/18; H10F 39/182; H10F 39/1865; H10F 39/80; H10F 39/8053; H10F 39/8063; H10F 77/488; H10F 77/331; H10F 77/40; H10F 77/45; H10F 77/484; H10F 30/00; B29C 2059/023; B29C 33/3878; B29C 35/0261; B29C 59/022; B29C 59/026; G06V 10/141; G06V 10/147; G06V 10/60
USPC ............. 33/270, 271, 228, 1 DD, 1 SC, 392; 250/203.1, 203.4, 241 R, 206, 372; 968/414, 416, 415, 925; 368/15, 223, 82, 368/239, 79; 356/480; 359/622; 382/232, 306; 385/13; 701/28, 37
See application file for complete search history.

(56) References Cited

U.S. PATENT DOCUMENTS

| | | | | |
|---|---|---|---|---|
| 4,835,875 A * | 6/1989 | Fuller | G04B 49/02 33/270 |
| 6,570,617 B2 * | 5/2003 | Fossum | H04N 25/78 348/E3.018 |
| 7,302,118 B2 * | 11/2007 | Liu | H04N 1/32128 382/232 |
| 7,516,557 B2 * | 4/2009 | Courter | G01W 1/12 33/270 |
| 7,552,026 B2 * | 6/2009 | Zhang | B64G 1/363 702/155 |
| 8,049,150 B2 * | 11/2011 | Johnson | H10F 77/488 136/246 |
| 8,174,703 B2 * | 5/2012 | Wang | G01N 29/14 385/13 |
| 8,333,016 B1 * | 12/2012 | Keele | G04B 49/02 33/270 |
| 8,367,995 B2 * | 2/2013 | Elshafei | G01S 19/14 250/203.1 |
| 8,450,773 B1 * | 5/2013 | Kim | H10F 30/21 257/E31.019 |
| 9,041,135 B2 * | 5/2015 | Janson | H10F 77/334 257/435 |
| 9,691,873 B2 * | 6/2017 | Rogers | H01Q 7/00 |
| 9,834,030 B2 * | 12/2017 | Tompkin | B42D 25/29 |
| 9,927,510 B2 * | 3/2018 | Waldron | G01S 3/7867 |
| 10,884,251 B2 * | 1/2021 | Karafin | G03H 1/02 |
| 11,169,387 B2 * | 11/2021 | Tillkorn | G02B 27/285 |
| 11,204,450 B2 * | 12/2021 | Shen | G02B 7/023 |
| 11,686,890 B2 * | 6/2023 | Miller | G02B 1/115 359/566 |
| 2003/0234341 A1 * | 12/2003 | Osborn | G01C 21/24 250/203.4 |
| 2012/0014569 A1 * | 1/2012 | Frye | G06V 40/1318 382/124 |
| 2012/0227273 A1 * | 9/2012 | Morcom | G01C 17/34 33/270 |
| 2014/0291480 A1 * | 10/2014 | Bruder | G01S 17/89 250/206 |
| 2015/0276913 A1 * | 10/2015 | Mehrl | G01S 3/7862 250/203.1 |
| 2016/0076887 A1 * | 3/2016 | Carroll | G04B 49/02 33/271 |
| 2016/0178879 A1 * | 6/2016 | Ford | G02B 19/0028 29/527.1 |
| 2016/0200161 A1 * | 7/2016 | Van Den Bossche | G01B 11/24 250/206 |
| 2018/0166489 A1 * | 6/2018 | Sao | H10F 39/8057 |
| 2021/0183031 A1 * | 6/2021 | Lin | G02B 30/27 |
| 2022/0406601 A1 * | 12/2022 | Uppili | H10P 34/42 |

OTHER PUBLICATIONS

Liebe, C.C. et al. Micro Sun Sensor. IEEE Aerospace Conference, Proceedings, vol. 5, Jan. 1, 2002, pp. 2263-2273 [online], [retrieved on Jul. 21, 2025]. Retrieved from the Internet <URL: https://ieeexplore.ieee.org/document/931388?source=IQplus> <DOI: 10.1109/AERO.2001.931388.> (Year: 2002).*

Mobasser et al. MEMS based sun sensor on a chip. IEEE Conference on Control Applications, Proceedings, vol. 2, Jun. 25, 2003, pp. 1483-1487 [online], [retrieved on Jul. 21, 2025]. Retrieved from the Internet <URL: https://ieeexplore.ieee.org/document/ 1223233?source=IQplus> <DOi: 10.1109/CCA.2003.1223233.>. (Year: 2003).*

Li, Wen-Yang, et al. "Error compensation for area digital sun sensor." Sensors 12.9 (2012): 11798-11810.

Fontani, D., et al. "Pointing sensors and sun tracking techniques." International Journal of Photoenergy 2011 (2011).

* cited by examiner

MICRODIAL—MINIATURIZED APPARATUS FOR SOLAR TIME KEEPING

REFERENCE TO RELATED APPLICATION

This application is a non-provisional of, and claims priority to and the benefits of, U.S. Provisional Patent Application No. 63/313,573 filed on Feb. 24, 2022, the entirety of which is herein incorporated by reference.

BACKGROUND

This disclosure concerns a miniaturized apparatus for tracking the apparent motion of the sun using a light mask, a pixilated image sensor, and an image processing unit.

A wafer thin light mask with markings on its top and bottom surface is placed in close proximity to a pixilated image sensor. Transmitted sunlight through the light mask, together with the image processing unit, allows the apparatus to make time, latitude, direction, and date measurements.

Historically, the apparent motion of the sun and solar time keeping have been tracked using an apparatus known as the sundial. In its simplest form, the sundial is composed of two components: (i) the gnomon, which is a shaped piece used to cast a shadow, and (ii) the dial plate, upon which the gnomon shadow falls and which contains encoded information (markings) used for solar tracking. Both components are passive, where the gnomon is in a fixed position relative to the dial plate and the sundial assembly remains fixed during operation. A User makes a measurement by visually identifying where the gnomon shadow aligns with the dial plate markings. The dial plate has pre-determined information for a given location (or latitude) encoded on its surface, such that the User can measure time at their specific location.

This generally limits the operation of the sundial to a specific latitude in order to maintain measurement accuracy. The sundial assembly must also be oriented toward a cardinal direction (North) during operation.

Alternative implementations include using a light spot projected through an aperture or a light spot reflected by a mirror onto the dial surface, such that the movement of the light spot is tracked instead of the movement of a shadow.

Traditional sundials were invented and fabricated with the intent to be viewed and read using unassisted human vision. This constrains how small a sundial can be made, as well as limits how sundial data can be digitally stored and analyzed.

Being composed of passive components and requiring a human user to visually identify the position of a shadow (or a light spot), conventional sundials lack the ability for direct-to-digital data logging and signal processing.

This limits the applicability of real-time computer-based analysis or remote operation.

Attempts have been made towards the use of digital and/or analog-type sun tracking devices using electronics. The sensors employed include Activated Pixel Sensors (APS) or quadrant-type photodetectors, where an opaque mask with a small aperture(s) (pinholes) or slits etched through the mask layer allows light to fall upon the sensor surface. Mathematical algorithms are applied to the measured light intensity spots in order to link the device coordinates to the sun coordinates. These devices aim to measure sun angles and are primarily employed in applications for solar electricity generation, as opposed to time and location measurements.

Another disadvantage of the prior art is these devices do not have specific built-in reference points relative to their aperture(s).

Therefore, the prior art does not allow for straightforward measurement of time, latitude, or direction.

SUMMARY OF DISCLOSURE

Description

This disclosure concerns a miniaturized apparatus for tracking the apparent motion of the sun using a light mask, a pixilated image sensor, and an image processing unit. A wafer thin light mask with markings on its top and bottom surface is placed in close proximity to a pixilated image sensor. Transmitted sunlight through the light mask, together with the image processing unit, allows the apparatus to make time, latitude, direction, and date measurements.

DESCRIPTION OF THE DRAWINGS

The following description and drawings set forth certain illustrative implementations of the disclosure in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure concerns a miniaturized apparatus for tracking the apparent motion of the sun using a light mask, a pixilated image sensor, and an image processing unit. A wafer thin light mask with markings on its top and bottom surface is placed in close proximity to a pixilated image sensor. Transmitted sunlight through the light mask, together with the image processing unit, allows the apparatus to make time, latitude, direction, and date measurements.

The apparatus, termed MicroDial, is composed of three primary components: (1) a dual surface patterned light mask, (2) a pixilated image sensor, (3) an image processing unit (FIG. 1), each described herein.

The pixilated image sensor, which is composed of independent photodetectors, collects light intensity after sunlight passes through the dual surface patterned light mask, and this light intensity information is then sent to the image processing unit for User interaction.

No additional optical components are required for image magnification.

Example (1) Dual Surface Patterned Light Mask

The MicroDial apparatus uses a light mask made from a transparent or semi-transparent material that can range in thickness between approximately 10-500 microns and it can be flexible or rigid. The scale of the dial plate markings is determined by the thickness of the light mask and the desired number of daily hours of operation.

Figure 1:
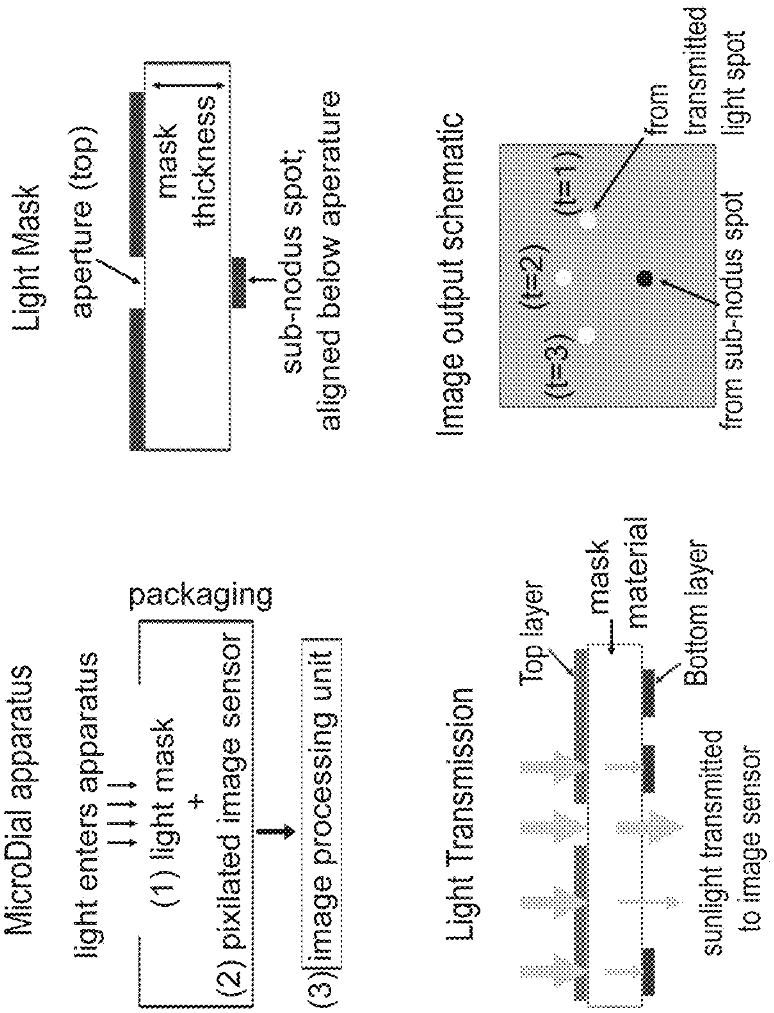
FIG. 1 illustrates a design and operation of our MicroDial. Illustrated is a schematic identifying the components for the MicroDial apparatus. Also illustrated is a cross section showing the simplest configuration of the light mask, where the ‘sub-nodus spot’ on the bottom side is vertically aligned to an aperture patterned on the top side. A schematic shows the transmission of light through the light mask. The patterned layers on the top and bottom surface are aligned and used to control the light transmissivity through the mask. Information can be encoded into the light mask by the pattern design. Example image output using the mask design at three different times (t=1, t=2, t=3). The dark spot arises from the sub-nodus spot, while the white spots arise from transmitted light entering the aperture in the top mask surface as the sun moves across the sky. Due to rotational symmetry, the relative position of the light and dark spots remain the same, regardless of the in-plane rotation of the apparatus.

The light mask is patterned on both surfaces with semi-transparent to opaque layers to define and encode the intensity of light transmitted through it (FIG. 1).

The patterned markings on the outer surfaces of the light mask (i.e., the top and bottom surfaces) are aligned with each other and the individual patterned features range in size from approximately 1-1000 microns and can be fabricated using conventional photolithography.

Due to the thinness of the light mask, photolithographic alignment between patterns on the top and bottom surfaces through the transparent/semi-transparent mask is achievable using conventional optical mask aligners.

The 'bottom surface'—defined here as the light mask surface closest to the image sensor surface—can contain encoded information (or markings) traditionally found on the dial plate of a sundial.

The projection of these markings remain stationary on the image sensor focal plane regardless of the position of the light source.

The 'top surface'—defined here as the light mask surface that is above the image sensor at a distance equal to at least the light mask thickness—can contain either an aperture (pinhole) to cast a light spot, or opaque markings to cast a shadow onto the image sensor.

Light transmitted through the top surface moves on the sensor focal plane according to the movement of the light source.

Information for measurement of time, latitude, and date can be encoded onto the light mask by choosing a specific patterned design applied to its bottom surface, analogous to conventional sundial plate implementations.

Alternatively, the minimum amount of encoded information is one reference mark, termed here the sub-nodus, which is vertically aligned to one aperture (the nodus) on the top of the mask to allow light to pass through the mask (FIG. 1).

In this configuration, all information about time, location, orientation and date is assessed via image processing and analysis of the relative position of dark and light spots to one another (FIG. 1).

Example (2) Pixilated Image Sensor

The pixilated image sensor is made of segmented photodiodes, whose size determines the resolution of the apparatus.

Examples of such sensors include the APS image sensor, in which the individual photodiodes can be as small as approximately 1 $\mu m^2$.

The image sensor itself can be either monochrome or have a color filter layer (e.g., Bayer layer) on its surface.

The overall image sensor size (and hence, the number of pixels) should be approximately the size of or greater than the dial pattern, which is set by the light mask thickness, the daily range of hours to be covered, and the index of refraction for the light mask material and can be made smaller than 150×150 $\mu m^2$.

The light mask is placed in proximity to the image sensor such that: (i) the shadow cast by the 'sub-nodus spot' (bottom side of mask) appears stationary on the sensor focal plane during operation, and (ii) the light spot transmitted through the aligned aperture(s) on the top surface of the light mask move on the sensor focal plane relative to the apparent motion of the sun.

Example (3) Image Processing Unit

The output of the pixilated image sensor is sent to an image processing unit for data reading and capture, data storage, and data analysis.

The output from the image sensor can be directly wired or transmitted to the image processing unit.

The image processing unit can be used to automatically determine the relative position of the bright and dark features on the image (e.g., FIG. 1), and subsequently determine variables such as time, location, and date.

For example, when time and latitude information is not encoded on the light mask, this information can be stored or accessed by the image processing unit. Besides determining the time, the User can input basic information to define other parameters for the image analysis including, for example: (i) zip code information (latitude) and time in order to determine date, or (ii) local time and date to determine latitude.

Example (4) Operation

Figure 3:
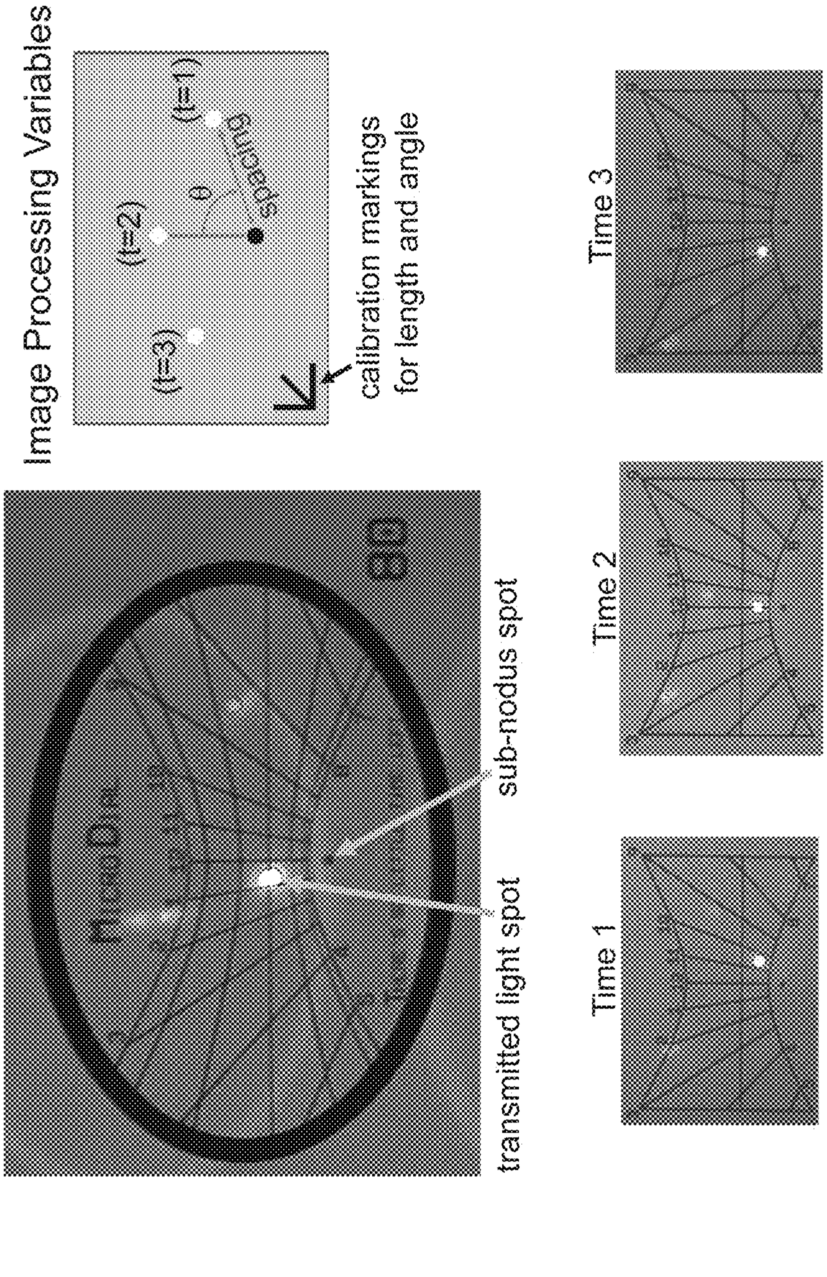
FIG. 3 illustrates Operation of the MicroDial apparatus. The image was acquired from the apparatus during operation in sunlight. The image has two primary regions of optical contrast: ‘black’ and ‘white’. In this example, the measurement of time can be completed by the User visually inspecting where the white spot falls on the encoded hour lines. A schematic shows variables to be analyzed for image recognition software if hour lines are not encoded onto the light mask. Also illustrated are images captured by the image sensor showing a different set of encoded hour lines and images captured at different times (labeled time 1, time 2, and time 3).
Figure 4:
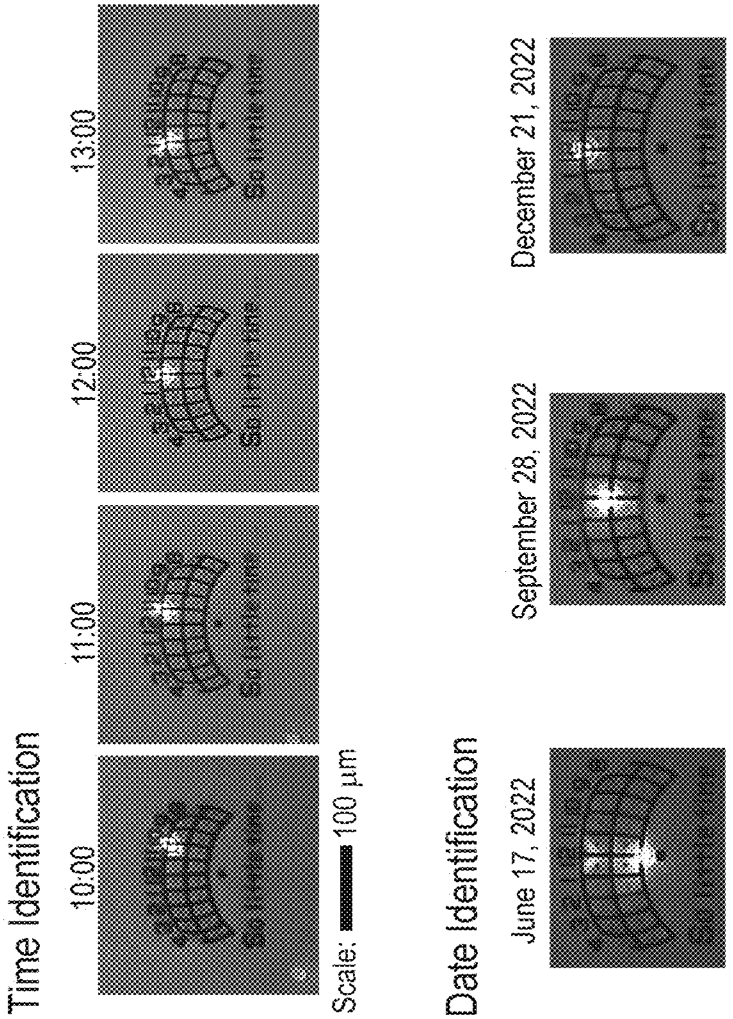
FIG. 4 further illustrates Operation of the MicroDial apparatus. Example image output from one day at different times are labeled. The hour lines and times are encoded onto the light mask. Another example shows identification of different dates throughout the year. In this example, the lowest curved line marks the date for the Summer solstice while the upper line marks the date for the Winter solstice. The middle horizontal curved line marks the date for the Spring and Fall equinoxes.

When sunlight passes through the light mask, the resultant spatial distribution of sunlight intensity is collected and read out by the pixilated image sensor (FIG. 3 and FIG. 4).

Figure 2:
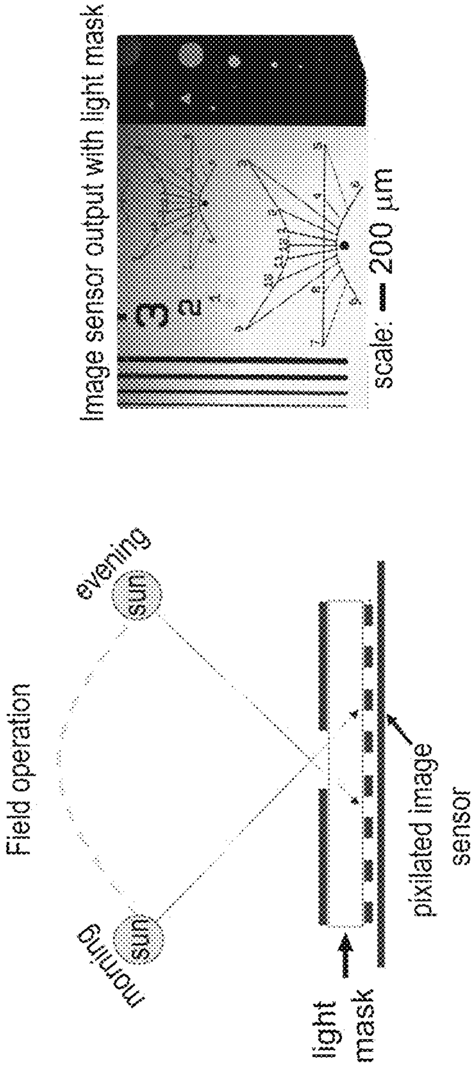
FIG. 2 illustrates a prototype testing of a setup (light mask+image sensor). A schematic shows the operation of the apparatus throughout the day. Also illustrated is the digital image output from the image sensor with light mask in ambient room light. The lateral size of the glass mask is approximately 4×4 $mm^2$. The smallest features (3 microns wide printed lines) are resolvable from the light mask, as well as the transmitted light spot produced from apertures measuring 9 microns in diameter.

FIG. 2 shows an example of the image output using a light mask with only its bottom surface patterned and with the light mask positioned directly on the pixilated image sensor surface.

The image in FIG. 2 was captured using an image processing unit (a laptop computer in this example) connected to the image sensor while the light mask was illuminated with room light.

In this example, the smallest patterned features on the light mask are 3 micron wide lines, and 9 μm diameter apertures.

The magnification of the system is built into the apparatus by the size of the pixels in the image sensor, which measure approximately 1 $\mu m^2$ here.

During operation, the 'dark' features in the resulting image are a result of the patterned layer on the bottom surface of the mask shadowing (blocking) light from reaching the underlying photodiode pixels (FIG. 2).

Since the marking on the masks' bottom surface are at the sensor surface, the shadowing effect doesn't spatially vary as the angle of incident light changes.

The 'white' regions of the image are from photodiode pixels exposed to light through the mask (FIG. 2).

The clarity of the image and overall good contrast of the mask features can enable the application of machine learning and image recognition software to track and determine the relative position of light and dark spots on the image.

Example (5)

When both sides of the light mask are patterned with aligned features (e.g., FIG. 1), the assembly can be used for solar tracking and for time measurements.

FIGS. 3 and 4 shows the operation of the MicroDial apparatus in sunlight, where the light mask has been encoded with specific time and date information so that the user can directly read information from the image.

In FIG. 3, both the 'sub-nodus spot' and the transmitted 'light spot' are labeled. In the absence of directly encoded information on the light mask, FIG. 3 shows sample variables that image recognition software could use to determine time and date.

FIGS. 3 and 4 illustrate different operational light masks. They also show solar tracking data from the same location (i) at different times during one day, and (ii) for different dates at the same time of day.

Example (6)

Conventional cameras that use pixilated image sensors can have the light mask component included in the light path between the pixilated image sensor and any filters/lenses that may exist for the camera. Depending on the additional optical elements used, the appropriate updates would be made in the post-processing analysis to take into account changes to the transmitted light path. If employed in consumer electronics with a digital display, user software (e.g., Apps) can be paired with the MicroDial image output to, for example: (i) overlay digitally produced markings (e.g., hour lines) for direct reading by the user, or (ii) directly output information from the digitally analyzed image (e.g., time, location, direction).

Example (7)

Light transmission through the light mask can be further engineered by: (i) using anti-reflective coatings on its surfaces to improve light transmission at more oblique (lower) light angles, (ii) varying the index of refraction of the light mask material (locally or globally) to tune light refraction so as to change the transmitted daily tracks across the image sensor surface, or (iii) through-holes formed across the thickness of the light mask together with patterned layers.

Some advantages and new features of this MicroDial include, but are not limited to, size, implementation, operation at any latitude, remote operation, and operation under motion.

Size: The active area of the MicroDial is defined in part by the thickness of the light mask, the index of refraction of the light mask material, and the total hours of desired daily coverage.

For example, if the light mask is made from 100 μm thick glass, the active area of the dial measures less than 150×150 $\mu m^2$. This small footprint, in addition to the small footprint of pixilated image sensors allows the packaged apparatus to be ultra-compact.

Implementation: Pixelated image sensors are ubiquitous in consumer electronics, including smartphones, tablets, and cameras. The MicroDial apparatus can be integrated into existing consumer electronics that use pixilated image sensors with digital displays, or it can be added post development into the optical stack of any camera that uses pixilated image sensors.

Operation at any latitude: In its simplest mode of operation (e.g., FIG. 1), the MicroDial collects information on the relative position of the reference sub-nodus spot and a light spot(s). When the User supplies location information, the apparatus can then be used for local solar time measurements.

Remote operation: Since information about the position of the sun is collected and stored by the MicroDial apparatus, it can be operated remotely.

Operation under motion: When a built-in orientation sensor is available on the image sensor or processing unit (e.g., EXIF sensor or built-in compass sensor), then the MicroDial apparatus can operate without needing directional alignment to North and can operate under continual motion while the unit remains level.

The above examples are illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A miniaturized apparatus for tracking the apparent motion of the sun, comprising:

a light mask;

wherein the light mask has a top surface and a bottom surface;

wherein the light mask comprises a dual-surfaced patterned light mask having patterned markings on both the top surface and the bottom surface that are laterally aligned with each other;

wherein the patterned markings are aligned to control light transmissivity through the dual-surfaced patterned light mask;

wherein the dual-surfaced patterned light mask comprises a light mask made from a transparent or semi-transparent material;

wherein the thickness of the dual-surfaced patterned light mask ranges between 10-300 microns; and wherein the dual-surfaced patterned light mask is flexible or rigid;

wherein the bottom surface is in closer proximity to the pixilated image sensor than the top surface; and an image processing unit configured to execute image recognition software to automatically determine the relative position of light and dark features captured by the pixilated image sensor and subsequently calculate and output real-time solar navigational telemetry comprising at least one of time, latitude, direction, or date;

wherein the miniaturized apparatus tracks the apparent motion of the sun;

wherein the light mask comprises a wafer thin light mask with markings on its top and bottom surface; and wherein the wafer thin light mask with markings on its top and bottom surface is in contact with the pixilated image sensor.

2. The miniaturized apparatus for tracking the apparent motion of the sun of claim 1, wherein individual patterned features of the light mask have a 3-micron line width and 9-micron apertures to establish a 1:3 geometric ratio optimized to maximize spatial contrast of shadow patterns shifting across the 10-300 micron thickness of the light mask.

3. The miniaturized apparatus for tracking the apparent motion of the sun of claim 2, wherein the image processing unit outputs time, latitude, direction, and date the image processing unit is further configured to receive an input of a local date and a local time from a user to mathematically determine a local latitude coordinate.

4. The miniaturized apparatus for tracking the apparent motion of the sun of claim 3, wherein the pixilated image sensor comprises independent photodetectors.

5. The miniaturized apparatus for tracking the apparent motion of the sun of claim 4, wherein the pixilated image sensor collects light intensity after sunlight passes through the dual-surfaced patterned light mask; and wherein the light intensity is received by the image processing unit;

wherein an active area of the pixilated image sensor is smaller than $150\times150\ \mu m^2$, and wherein individual pixel elements within the pixilated image sensor measure approximately $1\ \mu m^2$.

6. The miniaturized apparatus for tracking the apparent motion of the sun of claim 5, wherein the light mask is patterned on the top surface and the bottom surface with semi-transparent to opaque layers to define the intensity of light transmitted through it;

wherein the patterned markings on the top surface and bottom surface of the light mask are aligned with each other and are fabricated using conventional photolithography.

7. A method of making a miniaturized apparatus for tracking the apparent motion of the sun, comprising the steps of:

providing a light mask;

providing a pixilated image sensor;

wherein the light mask has a top surface and a bottom surface;

wherein the light mask comprises a dual-surfaced patterned light mask having patterned markings on both the top surface and the bottom surface that are laterally aligned with each other;

wherein the patterned markings are aligned to control light transmissivity through the dual-surfaced patterned light mask;

making the dual-surfaced patterned light mask from a transparent or semi-transparent material;

wherein the thickness of the dual surface patterned light mask ranges between 10-300 microns; and wherein the dual-surfaced patterned light mask is flexible or rigid; and wherein the bottom surface is in closer proximity to the pixilated image sensor than the top surface;

providing an image processing unit;

configuring the image processing unit to execute image recognition software to automatically determine the relative position of light and dark features captured by the pixilated image sensor and subsequently calculate and output real-time solar navigational telemetry comprising at least one of time, latitude, direction, or date; and resulting in a miniaturized apparatus for tracking the apparent motion of the sun.

8. The method of making the miniaturized apparatus for tracking the apparent motion of the sun of claim 7, wherein individual patterned features of the light mask have a 3-micron line width and 9-micron apertures to establish a 1:3 geometric ratio optimized to maximize spatial contrast of shadow patterns shifting across the 10-300 micron thickness of the light mask.

9. The method of making the miniaturized apparatus for tracking the apparent motion of the sun of claim 8, further comprising the steps of:

transmitting sunlight transmitted through the wafer thin light mask with markings on its top and bottom surface, together with the image processing unit; and allowing the miniaturized apparatus for tracking the apparent motion of the sun to make time, latitude, direction, and date measurements.

10. The method of making the miniaturized apparatus for tracking the apparent motion of the sun of claim 9, further comprising the steps of:

utilizing independent photodetectors as the pixilated image sensor.

11. The method of making the miniaturized apparatus for tracking the apparent motion of the sun of claim 10, further comprising the steps of:

collecting via the pixilated image sensor light intensity after sunlight passes through the dual-surfaced patterned light mask; and receiving the light intensity using the image processing unit;

wherein an active area of the pixilated image sensor is smaller than $150\times150\ \mu m^2$, and wherein individual pixel elements within the pixilated image sensor measure approximately $1\ \mu m^2$.

12. The method of making the miniaturized apparatus for tracking the apparent motion of the sun of claim 11, further comprising the steps of:

patterning the top surface and the bottom surface of the light mask with semi-transparent to opaque layers to define the intensity of light transmitted through it;

aligning the patterned markings on the top surface and bottom surface of the light mask with each other; and fabricating the patterned markings using conventional photolithography.

* * * * *